(12) United States Patent
Heigl

(10) Patent No.: US 7,150,203 B2
(45) Date of Patent: Dec. 19, 2006

(54) MANIPULATOR FOR POSITIONING A TEST HEAD

(76) Inventor: Helmuth Heigl, Anemonenstrasse 3a, 83059 Kolbermoor (DE)

( * ) Notice: Subject to any disclaimer, the term of this patent is extended or adjusted under 35 U.S.C. 154(b) by 190 days.

(21) Appl. No.: 10/855,994

(22) Filed: May 28, 2004

(65) Prior Publication Data

US 2005/0005718 A1    Jan. 13, 2005

(30) Foreign Application Priority Data

Jun. 6, 2003   (DE)   ................................. 103 25 818

(51) Int. Cl.
*G01D 21/00* (2006.01)
(52) U.S. Cl. .................................... 73/866.5
(58) Field of Classification Search ............... 73/866.6, 73/868.5, 866.5, 865.8; 324/765, 758, 754; 13/866.5, 865.8
See application file for complete search history.

(56) References Cited

U.S. PATENT DOCUMENTS

| | | | |
|---|---|---|---|
| 5,821,440 A * | 10/1998 | Khater et al. | ............... 73/866.5 |
| 5,949,002 A * | 9/1999 | Alden | ........................ 73/866.5 |
| 6,006,616 A * | 12/1999 | Baker | ........................ 73/866.5 |
| 6,646,431 B1 * | 11/2003 | Parvez et al. | ............. 324/158.1 |

FOREIGN PATENT DOCUMENTS

| | | |
|---|---|---|
| DE | 0308348 | 3/1989 |
| DE | 10132389 | 1/2003 |
| DE | 10132489 | 4/2003 |
| EP | 4007011 | 9/1991 |

* cited by examiner

*Primary Examiner*—Robert Raevis
(74) *Attorney, Agent, or Firm*—Steven, Davis, Miller & Mosher, LLP

(57) ABSTRACT

A manipulator, particularly for positioning a test head (70), is provided with positioning means (10) for three-dimensionally positioning the test head (70). In addition, the manipulator is provided with a mount (30) for the test head (70). The mount (30) comprises a rotary guide (31) by means of which the test head (70) is rotatable about an axis of rotation (y). The rotary guide (31) comprises a mounting plate (40) connected to the positioning means (10) and a supporting plate (50) rotatable relative to the mounting plate (40) about the axis of rotation (y), the test head (70) being securable to the supporting plate (50). Mounting plate (40) and supporting plate (50) have concentric openings (41, 51) for receiving a connecting cable connecting the test head (70) and feeder sectors (42, 52) forming an aperture open to the edge of each of the mounting plate (40) and supporting plate (50).

19 Claims, 6 Drawing Sheets

MANIPULATOR FOR POSITIONING A TEST HEAD

BACKGROUND OF THE INVENTION

1. Field of the Invention

The invention relates to a manipulator serving particularly to position a test head. The manipulator comprises positioning means for three-dimensionally positioning a test head. In addition, the manipulator is provided with a mount for the test head. The mount comprises a rotary guide by means of which the test head is rotatable about an axis of rotation. The rotary guide comprises a mounting plate connected to the positioning means and a supporting plate rotatable relative to the mounting plate about the axis of rotation, the test head being securable to the supporting plate. Mounting plate and supporting plate have concentric openings for receiving a connecting cable connecting the test head.

2. Background Art

Such a manipulator usually has several degrees of translatory and rotational motion in being suitable for precisely three-dimensionally positioning a test head as required as a rule in the testing of electronic devices, such as, for example, ICs or wafers. For function testing electronic devices the relatively heavy test head needs to be precisely docked on a tester such as, for example, a device handler or wafer prober, furnishing the devices to be tested by the test head. Obtaining a genuine test result in testing the devices necessitates precise docking of the test head on the handler. This is why smooth, precise adjustment of the manipulator positioning the test head is mandatory One such manipulator of the aforementioned kind is described in German patent DE 40 07 011. Known furthermore from DE 101 32 489 A1 is a manipulator having precise replication in moving the test head by the positioning means comprising articulated arms pivotable in the horizontal plane coupled to horizontally travelling carriages. This achieves optional motion of the test head being split into translatory motion of the carriages and rotational motion of the articulated arms, resulting in a reproducible motion of the test head ensuring reliable docking of the test head on a handler.

A manipulator for positioning a test head on a handler is also disclosed as a test head robot in EP 0 308 348 B1. This manipulator has a rotary guide permitting rotation of the test head about an axis of rotation. The rotary guide comprises a circular supporting plate to which the test head is securable. The supporting plate is rotationally disposed in a mounting ring composed of a lower arcuate member and an upper arcuate member. The lower arcuate member is held stationary, whereas the upper arcuate member is located pivotable on the lower arcuate member. Opening up the upper arcuate member permits insertion of the supporting plate into the mounting ring. Pivoting the upper arcuate member into the closed position then locks the upper arcuate member to the lower arcuate member by locking means, so that the supporting plate is rotatably clamped in the mounting ring. The supporting plate is provided furthermore with openings through which a connecting cable can be inserted for connecting the test head.

Even though being able to open up the mounting ring facilitates clamping in place the supporting plate, the rotary guide of the known manipulator has proven to be unsatisfactory for installing and removing the test head. This is because the connecting cable, for sensing reasons, is as a rule non-releasably connected to the test head, thus requiring the free end of the connecting cable to be pulled through the opening in the supporting plate when securing the test head to the supporting plate. Pulling the connecting cable through the opening in the supporting plate is additionally made more difficult because the connecting cable, as a rule, is relatively thick and comparatively inflexible.

BRIEF SUMMARY OF THE INVENTION

The invention is based on the objective of sophisticating a generic manipulator to permit the test head to be secured relatively simply.

To achieve this objective it is provided for in a manipulator having the above has as set forth in claim 1, that the mounting plate and supporting plate now have feeder sectors forming an aperture open to the edge of the mounting plate and supporting plate respectively.

The manipulator in accordance with the invention is based on having discovered that to facilitate securing a test head, both the supporting plate supporting the test head and the mounting plate secured to the positioning means each comprises at least one feeder sector now making it possible to insert the connecting cable into the concentric openings of mounting plate and supporting plate sideways. Unlike prior art this now eliminates having to pull the connecting cable through the opening in the supporting plate. To insert the connecting cable the feeder sectors are positioned concentrically. Once the connecting cable is located in the concentric openings it is expedient to turn the supporting plate relative to the mounting plate, resulting in the feeder sectors no longer being concentrical so that the connecting cable is effectively prevented from dropping out of the openings. In addition, it has been discovered that in the incongruent positions of the feeder sectors the strength of the rotary guide is enhanced to thus take into account the relatively heavy weight of a test head.

Advantageous further embodiments of the manipulator in accordance with the invention read from claims 2 to 13.

It is of advantage when the opening in the mounting plate and/or the opening in the supporting plate are substantially circular to ensure secure receival of the connecting cable in the openings in rotation.

It is furthermore of advantage when the feeder sector of the mounting plate and/or the feeder sector of the supporting plate extends over a centering angle of the openings in the range approx. 5° to approx. 120°, preferably approx. 60°. In this way, the feeder sectors are sized to ensure both simple insertion of the connecting cable into the openings of the mounting plate and supporting plate and adequate strength of the mounting plate and supporting plate.

To increase the strength of the mounting plate or supporting plate the feeder sector of the mounting plate and/or the feeder sector of the supporting plate can be closed off to advantage by a closure segment. The closure segment contributes towards significantly increasing the torsional strength.

In one preferred aspect of the manipulator in accordance with the invention the rotary guide comprises a mounting ring rotatably mounted in the opening of the mounting plate, the supporting plate being secured to the mounting ring. The mounting ring connecting the mounting plate to the supporting plate makes it possible to rotate the supporting plate relative to the mounting plate about the axis of rotation.

Preferably, the mounting ring comprises an aperture, the length of which preferably equals at least the length of the feeder sectors. This ensures that the mounting ring does not obstruct inserting the connecting cable into the openings when the feeder sectors are positioned concentrically.

Advantageously, the mounting ring is supported axially by a number of first bearings and radially by a number of second bearings on the mounting plate. The first bearings thus handle axial loads and the second bearings radial loads. Decoupling the bearings in this way functionally has proven to be of advantage in supporting particularly heavy test heads.

For durable, reliable mounting it is of advantage when the first bearings and/or the second bearings are anti-friction or rolling bearings, preferably cylindrical roller bearings.

Preferably, the first bearings and the second bearings are arranged alternatingly to achieve an even distribution of the axial and radial loads. As an alternative, or in addition thereto, the first bearings and the second bearings may be arranged in groups distributed about the circumference and opening of the mounting plate. Such a configuration has the advantage that an added number of bearings can be provided in areas subject to high loads such as, for example, a portion of the mounting plate opposite the feeder sectors.

In another preferred aspect of the manipulator in accordance with the invention the mounting ring is provided with a guide portion for traction means connected to a drive. The drive permits rotation of the supporting plate connected to the mounting ring and thus of the test head. The drive is preferably manually actuated, for example, by means of a crank gear assembly, although an electric motor may also be provided if necessary.

Preferably, the traction means acting by friction or positive contact is secured to the ends of the mounting ring with the advantage that the aperture of the mounting ring and thus the feeder sectors of the mounting plate and supporting plate remain free. Although securing the traction means to the ends of the mounting ring results in the test head not being rotatable through 360°, but merely by a pivot angle primarily depending on the size of the aperture of the mounting ring, such a positioning means has proven in practice to be sufficient for precisely positioning the test head at the handler, it having been discovered in this case to advantageously guide the traction means via guide pulleys to ensure an adequate angle of wrap.

BRIEF DESCRIPTION OF THE SEVERAL VIEWS OF THE DRAWINGS

The manipulator in accordance with the invention will now be detained along with further advantages by way of an example embodiment with respect to the drawings showing the example embodiment merely diagrammatically, in which.

DETAILED DESCRIPTION OF THE INVENTION

Figure 1:
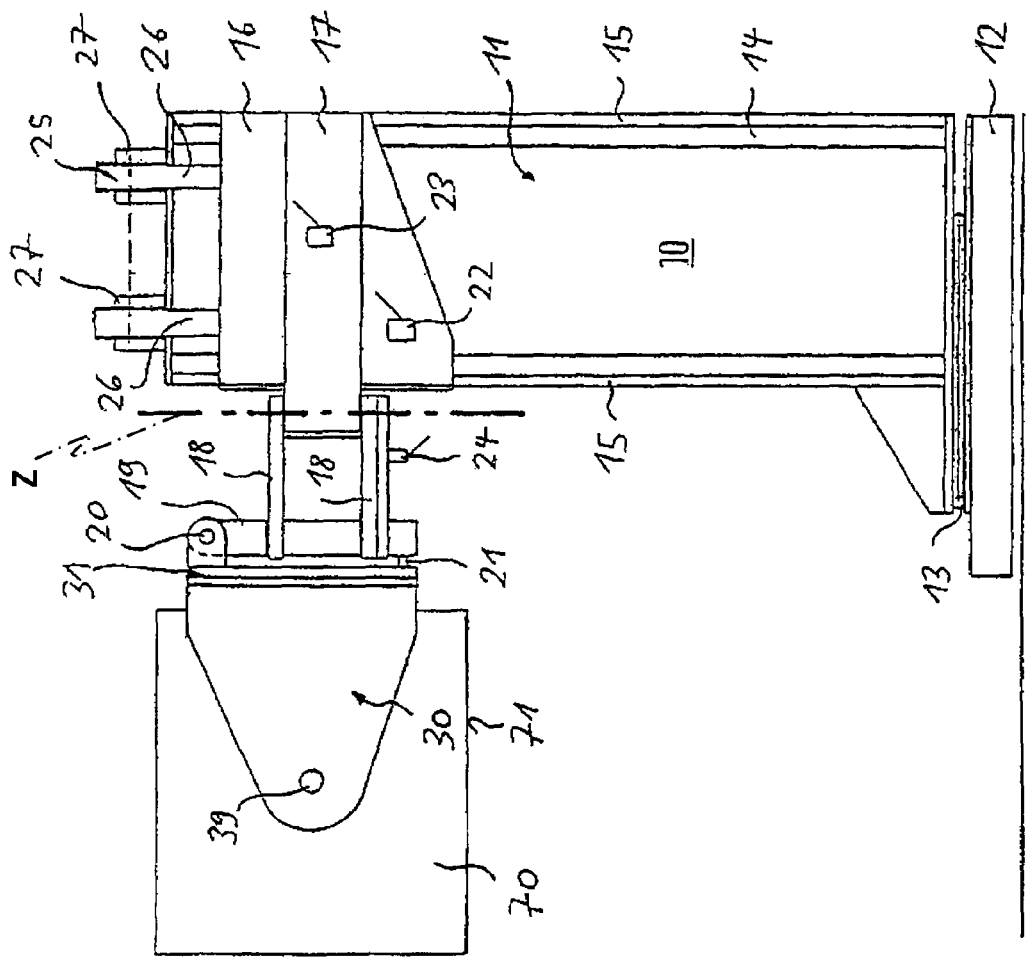
FIG. 1 is a side view of a manipulator mounting a test head.
Figure 2:
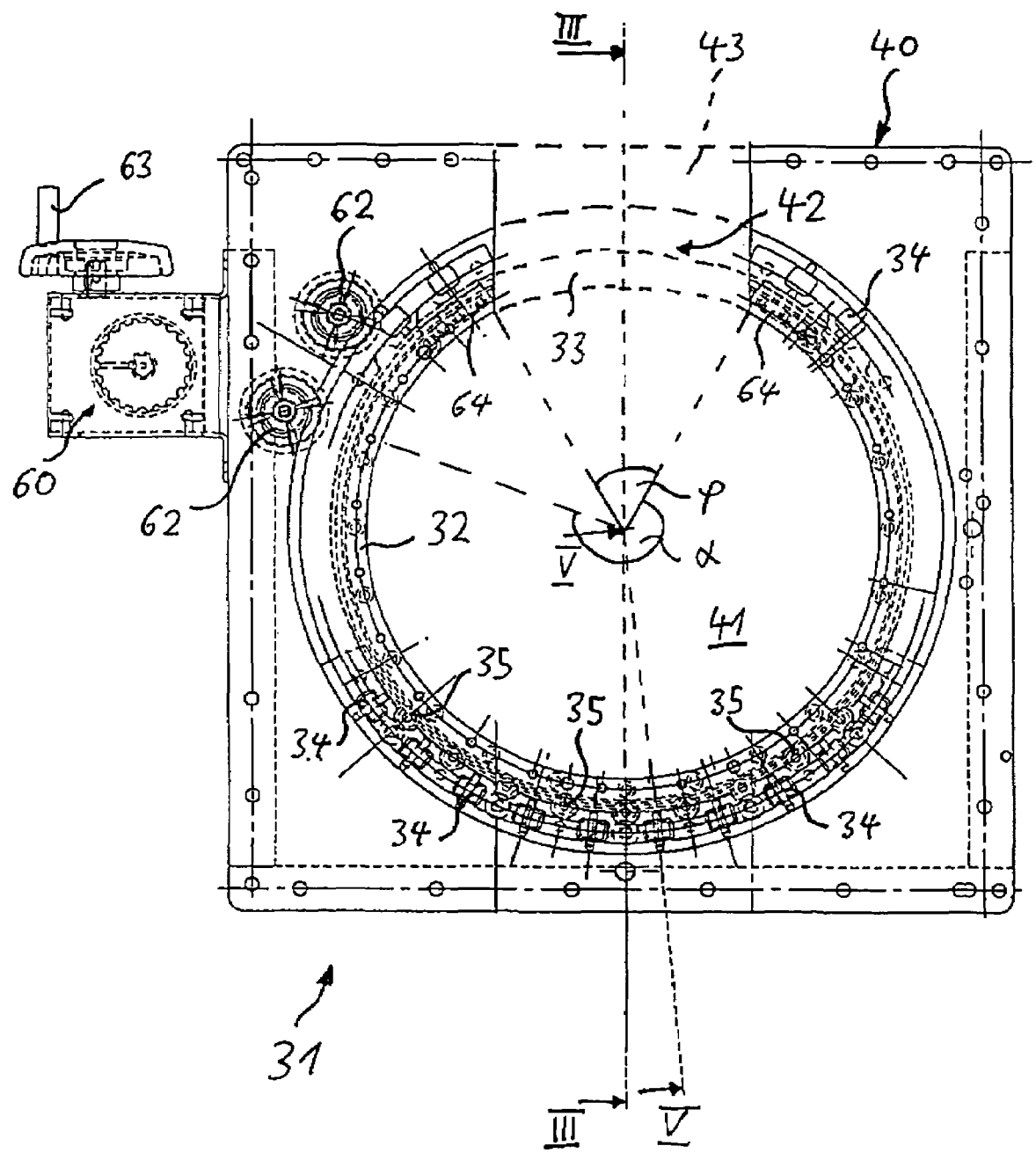
FIG. 2 is a side view of a rotary guide of the manipulator as shown in FIG. 1.

Referring now to FIG. 1 there is illustrated a manipulator serving to position a test head 70 on a device handler (not shown) such as, for example, an IC handler or wafer prober. For this purpose, the manipulator comprises positioning means 10 having a column 11 extending in the direction of a vertical axis z. The column 11 is composed of two uprights 14 spaced away from each other and arranged on a rotatable platform 13. The rotatable platform 13 located on a bed 12 permits rotation of the column 11 about the vertical axis z. Where necessary, the rotatable platform 13 may be guided on rails to permit horizontal displacement of the column 11.

Mounted on the uprights 14 are linear guides 15 by means of which a slave member 16 can be moved along the column 11, whereby the slave member 16 can be powered manually, hydraulically, pneumatically and/or electrically. In the latter case the linear guides 15 are expediently components of a linear motor. By means of a locking lever 22 the slave member 16 can be arrested in any desired position.

As evident from FIG. 1, the positioning means 10 comprise carriages 17 arranged on the slave member 16 for horizontal motion. An artisan understands that as FIG. 1 is a side view, only one carriage is shown in the drawing. However another carriage is arranged on the opposite side of the manipulator. The drive for the carriages 17 may be manual, hydraulic, pneumatic and/or electrical. With an electrical drive it is again expedient when the carriages 17 are components of a linear motor. Each of the carriages 17 (only one carriage shown), can be movable independently of the other, and the carriages 17 can be arrested in any desired position by means of a locking lever 23. It is furthermore evident from FIG. 1 how the carriages 17 are connected articulatedly to articulated arms 18 arranged in stacked pairs. The articulated arms 18 are pivotable about the vertical axis z and can be arrested in any desired position by means of a locking lever 24. Connected articulatedly at the end facing away from the carriages 17 with a vertical arm 19 are the articulated arms 18, a mount 30 for the test head 70 being arranged on the vertical arm 19. The substantially forked mount 30 is pivotable about a horizontal axis 20 at the upper end of the vertical arm 19. Arranged at the lower end of the vertical arm 19 is a spacer 21 by means of which a given tilt of the mount 30 with respect to the vertical arm 19 can be set.

The manipulator as shown in FIG. 1 is provided with a weight balancing system 25. The weight balancing system 25 serves to compensate the load on the positioning means 10 caused, as a rule, by the relatively heavy weight of the test head 70. For this purpose, the weight balancing system 25 comprises a counterweight guided in the column 11. The counterweight is connected to the slave member 16 by a belt 26 guided via a guide pulley 27 at the upper end of the column 11.

Evident furthermore from FIG. 1 is how the test head 70 is secured at the mount 30 for pivoting about a horizontal axis 39. In addition, the mount 30 is pivotable about an axis of rotation y by means of a rotary guide 31 so that a function surface 71 of the test head 70 can be positioned to practically any position three-dimensionally. Referring now to FIGS. 2 to 8 in particular there is illustrated how the rotary guide 31 comprises a mounting plate 40 connected to the positioning means 10 and a supporting plate 50 rotatable relative to the mounting plate 40 about the axis of rotation y. Secured to the supporting plate 50 is the test head 70. The mounting plate 40 and the supporting plate 50 are provided with concentric openings 41, 51 as is particularly evident from FIG. 8. These circular openings 41, 51 serve to accommodate a connecting cable non-releasably connected to the test head 70 for sensing reasons. To ensure comparitively simple insertion of the connecting cable into the openings 41, 51 the mounting plate 40 and supporting plate 50 each have a feed sector 42, 52 forming an aperture open to the edge of the mounting plate 40 and supporting plate 50 respectively. The feed sectors 42, 52 cover a centering angle φ of the openings 41, 51 of approximately 60° to thus facilitate inserting even a relatively thick connecting cable into the openings 41, 51. Once the connecting cable is located in the openings 41, 51, the feed sectors 42, 52 can be closed off by a closure segment 43, 53 to boost the strength of the mounting plate 40 and supporting plate 50.

Referring now to FIGS. 3 to 7 there is illustrated in particular how the rotary guide 31 comprises a mounting ring 32 rotatably mounted in the opening 41 of the mounting plate 40. The mounting ring 32 rigidly connected to the sup-porting plate 50 has an aperture 33, the length of which corresponds in the circumferential direction of the openings 41, 51 roughly to the centering angle φ. and thus to the length of the feed sectors 42, 52 in the circumferential direction of the openings 41, 51. This makes sure that when the feed sectors 42, 52 are positioned concentrically, as shown in FIG. 8, the mounting ring 32 does not obstruct insertion of the connecting cable into the openings 41, 51.

Axially, the mounting ring 32 is supported by a number of first bearings 34 and radially by a number of second bearings 35. The first bearings 34 and second bearings 35 are configured as cylindrical roller bearings arranged alternatingly. As is particularly evident from FIG. 2 and FIG. 8 the bearings 34, 35 are arranged in three groups equidistantly distributed around the circumference of the openings 41 of the mounting plate 40. Grouping the bearings in this way restricts providing the bearings 34, 35 in areas of high loading in thus contributing towards production in keeping with the loading requirements as well as cost effectively for economic production. The bearings 35 are secured by means of fastener plates 36 around the circumference of the openings 41 at the mounting plate 40 as is particularly evident from FIG. 4. As compared to this, it is evident from FIG. 6 how the bearings 34 are guided in two rows at the inner surface areas of guide plates 37 secured to the mounting ring 32.

Figure 3:
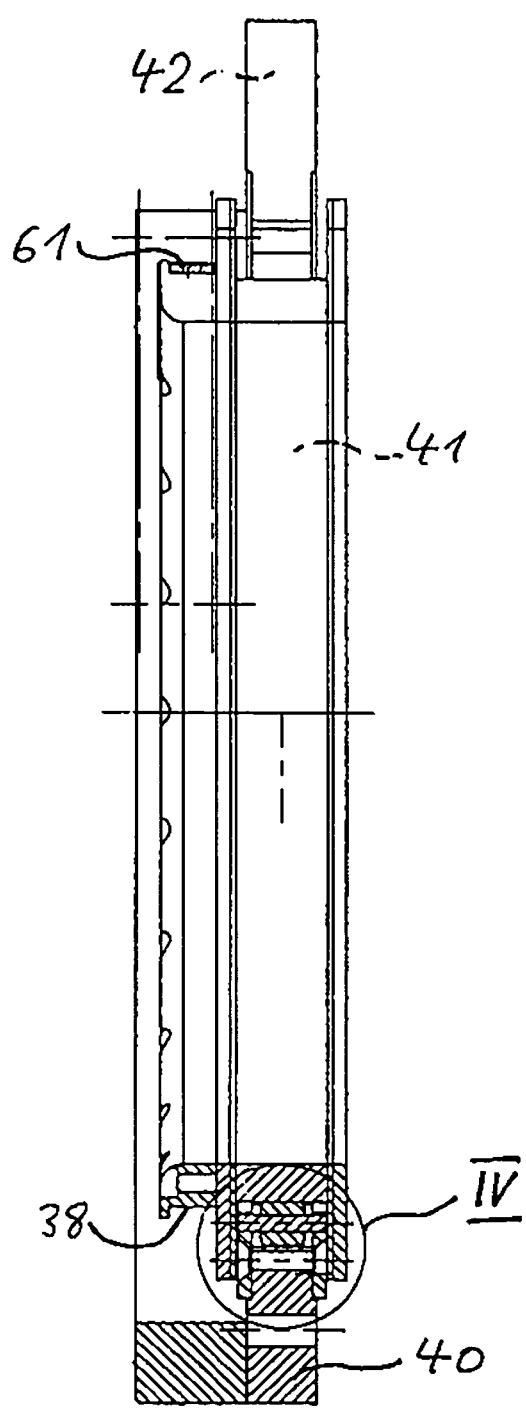
FIG. 3 is a section taken along the line III—III in FIG. 2.
Figure 4:
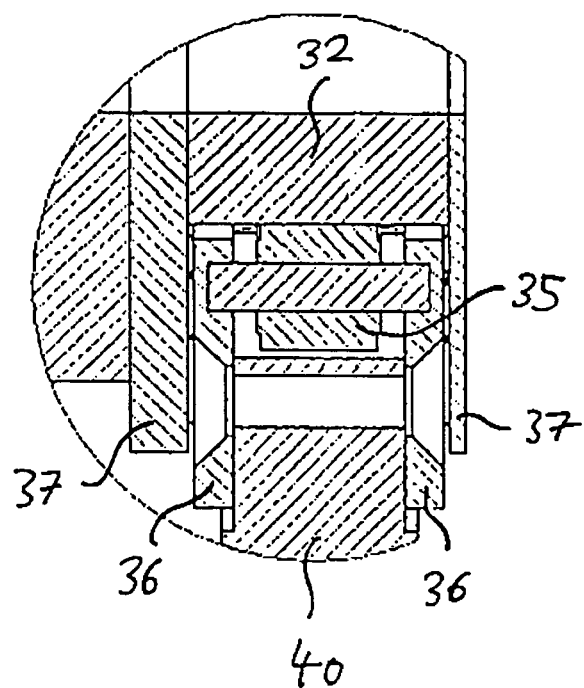
FIG. 4 is a magnified view of the portion identified IV in FIG. 3.
Figure 5:
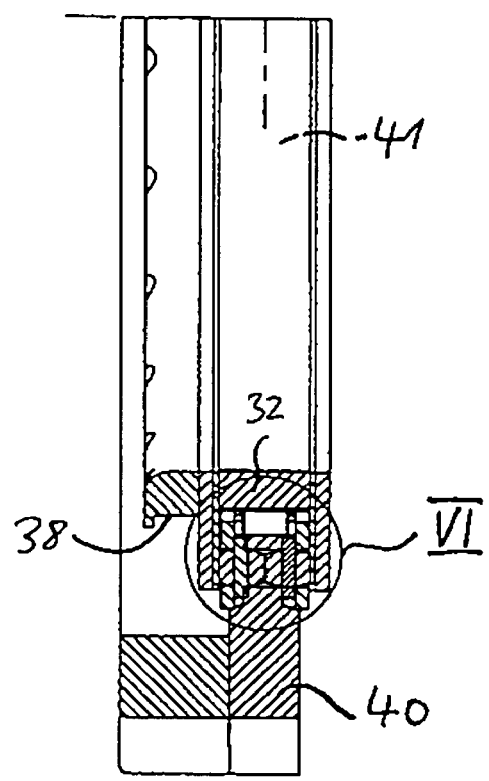
FIG. 5 is a section taken along the line V—V in FIG. 2.
Figure 6:
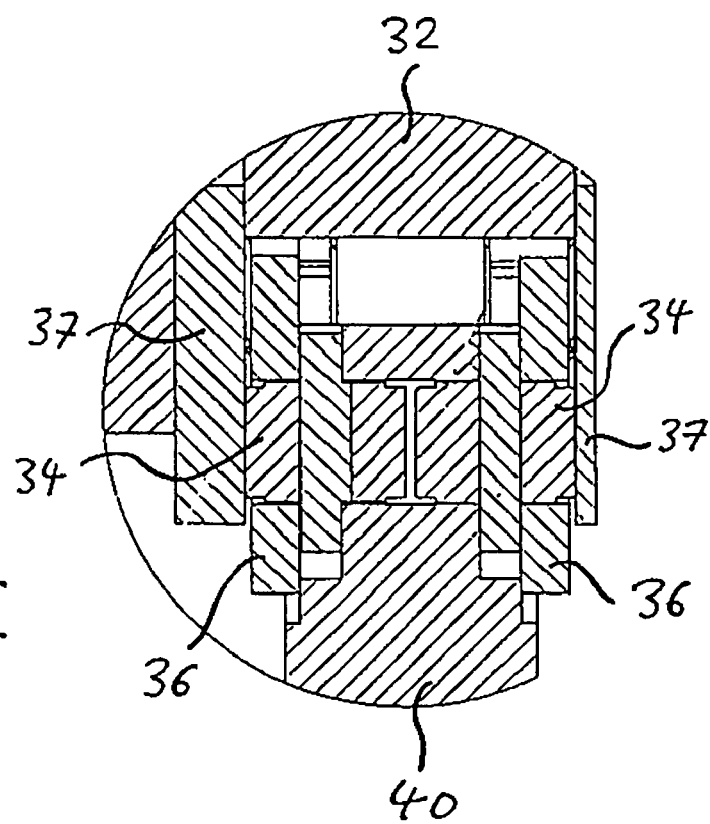
FIG. 6 is a magnified view of the portion identified VI in FIG. 5.
Figure 7:
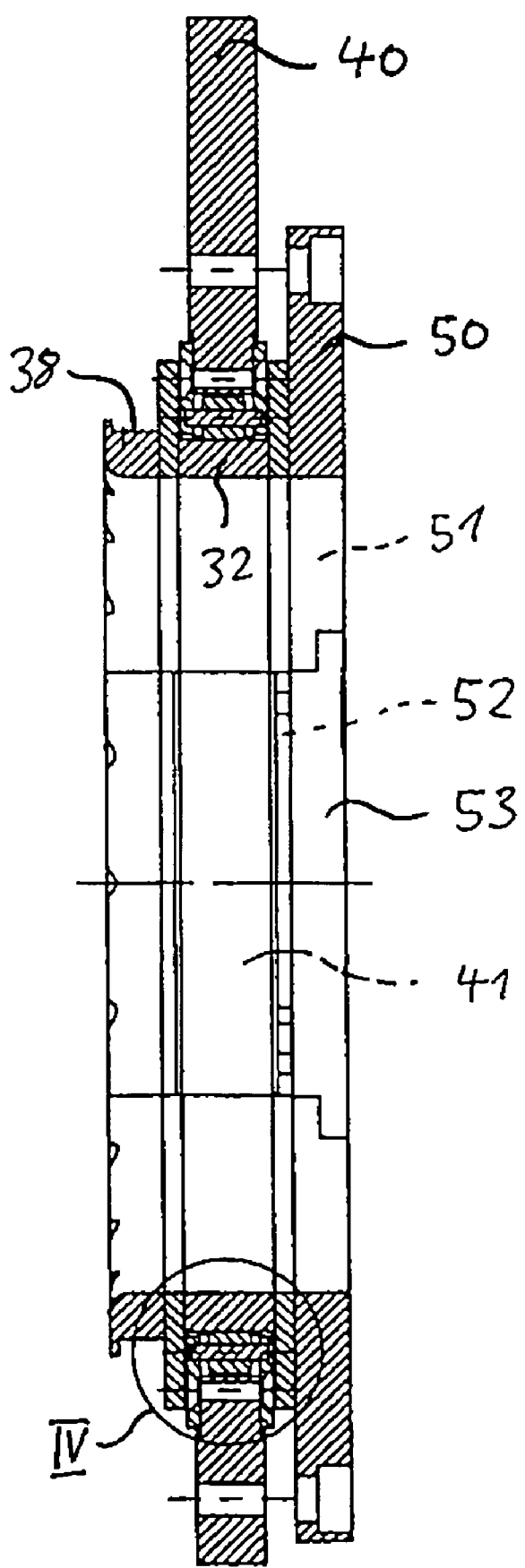
FIG. 7 is a cross-section through the rotary guide showing a supporting plate connected to a mounting plate.
Figure 8:
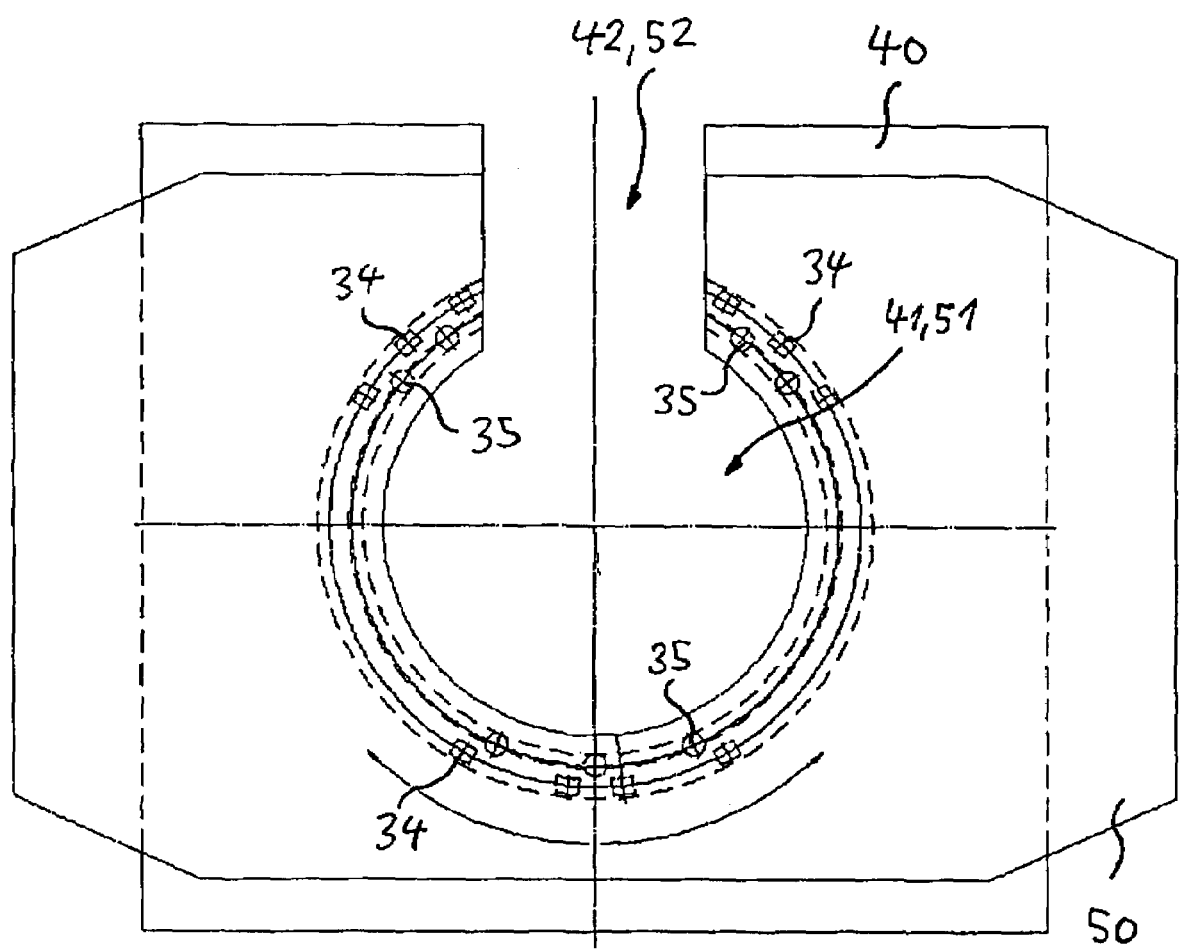
FIG. 8 is a side view of the mounting plate and supporting plate as shown in FIG. 7.

Referring now to FIGS. 3, 5 and 7 there is illustrated how the mounting ring 32 is provided with a guide portion 38 for a traction means 61. The traction means 61 expediently configured as a ribbed belt is connected to a drive 60 configured as a crank gear assembly, and thus manually actuating a crank 63 permits rotating the mounting ring 32 and thus the supporting plate 50 mounting the test head 70 about the axis of rotation y. The traction means 61 is not an endless belt, it instead being secured by clamping plates 64 to the ends of the mounting ring 32, as evident from FIG. 2, so that the mounting ring 32 can be rotated through an angle of rotation α of approximately 270°. The size of the angle of rotation α depends on the length of the aperture 33, for one thing, and, for another on the arrangement of the guide pulleys 62 via which the traction means 61 is guided. The guide pulleys 62 ensure an adequate angle of wrap of the traction means 61.

The manipulator as described above is characterized by a relatively simple means for securing the test head 70. The reason for this is especially that the mounting plate 40 and supporting plate 50 are provided with the feed sectors 42, 52 ensuring facilitated insertion of the connecting cable connected to the test head 70 into the openings 41, 51 even when the connecting cable—as is often the case—is relatively thick and inflexible. Where necessary, the feed sectors 42, 52 can be closed off by closure segments 43, 53 to attain, more particularly, a high torsional strength of the mounting plate 40 and supporting plate 50 satisfying the mechanical loading requirements resulting from a relatively heavy test head 70. What furthermore contributes towards a load-compatible configuration is splitting the axial and radial loads to first bearings 34 and second bearings 35. Last, but not least, the traction means 61 driving the mounting ring 32 permits smooth and precise rotation of the test head 70.

LIST OF REFERENCE SIGNS

| | |
|---|---|
| 10 | positioning means |
| 11 | column |
| 12 | bed |
| 13 | rotatable platform |
| 14 | uprights |
| 15 | linear guide |
| 16 | slave member |
| 17 | carriages |
| 18 | articulated arms |
| 19 | vertical arm |
| 20 | axis |
| 21 | spacer |
| 22 | locking lever |
| 23 | locking lever |
| 24 | locking lever |
| 25 | weight balancing system |
| 26 | belt |
| 27 | guide pulley |
| 30 | mount |
| 31 | rotary guide |
| 32 | mounting ring |
| 33 | aperture |
| 34 | first bearings |
| 35 | second bearings |
| 36 | fastener plate |
| 37 | guide plate |
| 38 | guide portion |
| 39 | axis |
| 40 | mounting plate |
| 41 | openings |
| 42 | feed sectors |
| 43 | closure segment |
| 50 | supporting plate |
| 51 | opening |
| 52 | feed sectors |
| 53 | closure segment |
| 60 | drive |
| 61 | traction means |
| 62 | guide pulley |
| 63 | crank |
| 64 | clamping plate |
| 70 | test head |
| 71 | function surface |
| y | axis of rotation |
| z | vertical axis |
| α | angle of rotation |
| φ | centering angle |

The invention claimed is:

1. A manipulator for positioning a test head, comprising:
positioning means for three-dimensionally positioning the test head, and
a mount for mounting the test head, said mount comprising a rotary guide by which the test head is rotatable about an axis of rotation, said rotary guide including a mounting plate connected to said positioning means and a supporting plate rotatable relative to said mounting plate about said axis of rotation,
the test head being securable to said supporting plate, and
said mounting plate and said supporting plate having concentric openings for receiving a connecting cable connecting the test head, and feeder sectors defining an aperture; said aperture being open to the edge of each of said mounting plate and said supporting plate.

2. The manipulator as set forth in claim 1, wherein one of said concentric openings of said mounting plate and said supporting plate is substantially circular.

3. The manipulator as set forth in claim 2, wherein one of said feeder sector of said mounting plate and said feeder sector of said supporting plate extends over a centering angle of said openings in the range of approx. 5° to approx. 120°.

4. The manipulator as set forth in claim 2, wherein one of said feeder sector of said mounting plate and said feeder sector of said supporting plate extends over a centering angle of said openings in the range of approx. 5° to approx. 60°.

5. The manipulator as set forth in claim 1, wherein both concentric openings of said mounting plate and said supporting plate are substantially circular.

6. The manipulator as set forth in claim 5, wherein both said feeder sector of said mounting plate and said feeder sector of said supporting plate extend over a centering angle of said openings in the range of approx. 5° to approx. 120°.

7. The manipulator as set forth in claim 5, wherein both said feeder sector of said mounting plate and said feeder sector of said supporting plate extend over a centering angle of said openings in the range of approx. 5° to approx. 60°.

8. The manipulator as set forth in claim 1, wherein one of said feeder sector of said mounting plate and said feeder sector of said supporting plate is closable by a closure segment.

9. The manipulator as set forth in claim 1, wherein both said feeder sector of said mounting plate and said feeder sector of said supporting plate are closable by a closure segment.

10. The manipulator as set forth in claim 1, wherein said rotary guide comprises a mounting ring rotatably mounted in said opening of said mounting plate, said supporting plate being secured to said mounting ring.

11. The manipulator as set forth in claim 10, wherein said mounting ring has an aperture, the length of said aperture equaling at least the length of said feeder sectors.

12. The manipulator as set forth in claim 10, wherein said mounting ring is supported axially by a number of first bearings and radially by a number of second bearings on said mounting plate.

13. The manipulator as set forth in claim 12, wherein one of said first bearings and said second bearings are rolling bearings.

14. The manipulator as set forth in claim 12, wherein both said first bearings and said second bearings are rolling bearings.

15. The manipulator as set forth in claim 12, wherein said first bearings and said second bearings are arranged alternatingly.

16. The manipulator as set forth in claim 12, wherein said first bearings and said second bearings are arranged in groups distributed about the circumference of said opening of said mounting plate.

17. The manipulator as set forth in claim 10, wherein said mounting ring has a guide portion for a traction means connected to a drive.

18. The manipulator as set forth in claim 17, wherein said mounting ring has a first end and a second end and said traction means is secured to said first end and said second end.

19. The manipulator as set forth in claim 17, wherein said traction means is guided by guide pulleys.

\* \* \* \* \*